(12) United States Patent
Lim et al.

(10) Patent No.: US 6,887,315 B2
(45) Date of Patent: May 3, 2005

(54) VACUUM PLATE HAVING A SYMMETRICAL AIR-LOAD BLOCK

(75) Inventors: Yu-Dong Lim, Gyeonggi-do (KR); Seung-Hoon Lee, Gyeonggi-do (KR); Hae-Jin Park, Seoul (KR)

(73) Assignee: Jusung Engineering Co., Ltd., Kyonggi-do (KR)

( * ) Notice: Subject to any disclaimer, the term of this patent is extended or adjusted under 35 U.S.C. 154(b) by 71 days.

(21) Appl. No.: 10/180,472

(22) Filed: Jun. 26, 2002

(65) Prior Publication Data

US 2003/0000472 A1 Jan. 2, 2003

(30) Foreign Application Priority Data

Jun. 26, 2001 (KR) ......................................... 2001-36785

(51) Int. Cl.[7] .......................... H01L 21/00; C23C 16/00
(52) U.S. Cl. ...................... 118/715; 118/725; 118/724; 118/728; 118/500; 156/345.29; 156/345.51; 156/345.52; 156/345.53; 156/911; 156/912
(58) Field of Search .................. 118/715–733, 500; 156/345.29, 345.51, 345.52, 345.53, 911, 912

(56) References Cited

U.S. PATENT DOCUMENTS 6,402,848 B1 * 6/2002 Horiguchi et al. .......... 118/715

FOREIGN PATENT DOCUMENTS

JP              62211914 A  *  9/1987  ......... H01L/21/205

* cited by examiner

Primary Examiner—Gregory Mills
Assistant Examiner—Ram N. Kackar
(74) Attorney, Agent, or Firm—Duane Morris LLP

(57) ABSTRACT

A vacuum plate for a fabricating apparatus of a semiconductor device, the vacuum plate includes: a first vacuum panel having a plurality of exhaust holes, the plurality of exhaust holes having same area and same distance from a center of the first vacuum panel, the plurality of exhaust holes being symmetrical and spaced apart from each other; and a second vacuum panel having a sidewall, a pumping hole and an air-load block, the sidewall being vertically protruded along an edge of the second vacuum panel, the air-load block being vertically protruded and symmetrical, a bottom surface of the first vacuum panel contacting a top surface of the sidewall and a top surface of the air-load block, thereby the first and second vacuum panels being combined.

17 Claims, 5 Drawing Sheets

VACUUM PLATE HAVING A SYMMETRICAL AIR-LOAD BLOCK

This application claims the priority benefit of Korean Patent Application No. 2001-36785, filed on Jun. 26, 2001.

BACKGROUND OF THE INVENTION

1. Field of the Invention

The present invention relates to a fabricating apparatus of semiconductor device, and more particularly to a vacuum plate of a low pressure chemical vapor deposition (LPCVD) apparatus that makes an exhaust flow uniform.

2. Description of the Related Art

Generally, LPCVD is a kind of chemical vapor deposition (CVD) in which a thin film is formed on a substrate by using a chemical reaction of chemical gases, and has a characteristic that a reaction pressure of the chemical gases is lower than an atmospheric pressure. In the LPCVD, that is, reactants of gas phase are chemically reacted under a pressure lower than the atmospheric pressure, thereby a product is deposited onto the substrate to form a thin film.

FIG. 1 is a schematic cross-sectional view of a conventional LPCVD apparatus.

In FIG. 1, the conventional LPCVD apparatus includes a single substrate type chamber 10 of a vertical furnace, a gas supplying unit 50 that stores and supplies the chamber 10 with reactants, and an environmental control unit 60 that controls an interior pressure of the chamber 10 low. A substrate 5 is loaded in the chamber 10 of sealed reaction vessel.

The gas supplying unit 50 includes a storage tank "T" stored with the reactants, and a plurality of tube type injectors 54a and 54b for injecting and diffusing the reactants of the storage tank "T" into the chamber 10. The plurality of tube type injectors 54a and 54b are vertically equipped to penetrate a bottom surface 12 of the chamber 10.

Preferably, the single substrate type chamber 10 includes a susceptor 20 having a heater 22 to heat the substrate 5 up for increasing a deposition rate. The substrate 5 is loaded on the susceptor 20 and a product of the chemical reaction of the injected reactants is deposited onto the substrate 5.

The environmental control unit 60 includes an exhausting tube 64 equipped to penetrate the bottom surface 12 of the chamber 10, and a vacuum pump "P" connected to the exhaust tube 64.

An inner pressure of the chamber 10 is controlled lower than the atmospheric pressure by the environmental control unit 60, and the reactants are supplied to the chamber 10 by the gas supplying unit 50. Accordingly, a thin film is formed on the substrate 5 through adsorption, decomposition, reaction and segregation between the reactants. Since the inner pressure of the chamber 10 is lower than the atmospheric pressure, a mean free path of the reactants is elongated. Accordingly, a concentration of the reactants becomes uniform over the substrate and it is easy to segregate residues on the substrate after the reaction.

In the LPCVD apparatus, the deposition rate "D" of the thin film may be expressed by the Arrhenius equation as follows.

$$D=kP^n exp(-E_a/kT),$$

where k is a constant, P is a pressure of the chamber (reaction vessel), $E_a$ is an activation energy of reaction gases and T is a temperature of the substrate. According to the Arrhenius equation, a uniform pressure and a uniform temperature are essential for fabricating a uniform thin film in the LPCVD apparatus.

Especially, in the single substrate type chamber 10 (of FIG. 1) compared with the batch type chamber, since the thin film is deposited with a very high deposition rate, the injection pressure of reaction gases and the exhaust pressure are also very high. Accordingly, reaction gases may stay in the single substrate type chamber for short periods of time and it is very hard to adjust the pressure of the single substrate type chamber uniform.

For the purpose of keeping a uniform pressure over the substrate, the injecting pressure of reaction gases and the exhaust pressure of residual gases should be kept uniform. Especially, since the higher exhaust pressure is required to keep a low pressure during the reaction process in the chamber for the LPCVD apparatus, the uniform exhaust pressure is an essential element for the uniform pressure over the substrate. As the exhaust pressure becomes non-uniform, a gas flow over the substrate also becomes non-uniform. Accordingly, the thin film deposited on the substrate does not have uniform thickness and a bit of powder resulting from vapor phase reaction of three-dimensional nucleation is generated in the chamber.

To prevent the non-uniformity of the exhaust pressure, an apparatus in which the exhaust tube 64 is equipped at the center of the bottom surface 12 of the chamber 10 may be considered. Generally, however, the susceptor 20 and a plurality of devices for driving the susceptor 20 are equipped at the center of the bottom surface 12 of the chamber 10. Therefore, the exhaust tube 64 cannot be actually equipped at the center of the bottom surface 12 of the chamber 10. To solve these problems, a vacuum plate 30 for the uniform gas flow over the substrate is equipped at the bottom surface 12 of the chamber 10.

FIG. 2 is a schematic disintegrated view showing a structure of a conventional vacuum plate for an LPCVD apparatus.

In FIG. 2, the conventional vacuum plate 30 includes an upper vacuum panel 30a and a lower vacuum panel 30b. The upper vacuum panel 30a has an upper susceptor hole 36a at its center and a plurality of upper injector holes 32a, 32b, 32c, 32d and 32e spaced apart from the upper susceptor hole 36a. The lower vacuum panel 30b also has a lower susceptor hole 36b at its center and a plurality of lower injector holes 33a, 33b, 33c, 33d and 33e spaced apart from the lower susceptor hole 36b. The upper and lower vacuum panels 30a and 30b are combined and equipped on a bottom surface 12 of a chamber. A susceptor and a plurality of devices for driving the susceptor (not shown) are equipped through the upper and lower susceptor holes 36a and 36b. Further, a plurality of injectors 54a, 54b, 54c, 54d and 54e are equipped through the plurality of upper and lower injector holes 32a, 33a, 32b, 33b, 32c, 33c, 32d, 33d, 32e and 33e, respectively.

The upper vacuum panel 30a includes a plurality of exhaust holes 34 and the lower vacuum panel 30b includes a pumping hole 40 to which one end of an exhaust tube 64 (of FIG. 1) is connected. Air flowing into the vacuum plate 30 through the plurality of exhaust holes 34 is exhausted through the pumping hole 40. An exhausting means such as a pump "P" which belongs to the environmental control unit 60 (of FIG. 1) is connected to the other end of the exhaust tube 64 (of FIG. 1).

If the interior of the chamber does not obtain ultra high vacuum or plenty of gases are not injected when a thin film is deposited by using the conventional vacuum plate 30 of the said structure, a phenomenon of non-uniform exhaust pressure happens. Since the interior of the chamber is exhausted through a pumping hole 40 that is asymmetrically located in the lower vacuum panel 30b, after the upper and lower vacuum panels 30a and 30b are combined, the exhaust flow is slanted. An exhaust pressure (the suction) at a portion "A" of the plurality of exhaust holes 34 formed on the upper vacuum panel 30a is higher than that at the other portions. Accordingly, unless the chamber is exhausted through the exhaust holes of the other portions except the portion "A" due to supplying plenty of gases or is kept an ultra high vacuum during the deposition of the thin film, a phenomenon of non-uniform exhaust pressure that an exhaust pressure at a portion "A" is higher than that at the other portions happens.

SUMMARY OF THE INVENTION

Accordingly, the present invention is directed to a fabricating apparatus and/or a vacuum plate therefor, that substantially obviates one or more of problems due to limitations and disadvantages of the related art.

An advantage of the present invention is to provide an improved vacuum plate for a uniform exhaust pressure.

Additional features and advantages of the invention will be set forth in the description that follows, and in part will be apparent from the description, or may be learned by practice of the invention. Other advantages of the invention will be realized and attained by the structure particularly pointed out in the written description and claims hereof as well as the appended drawings.

To achieve these and other advantages and in accordance with the purpose of the present invention, as embodied and broadly described, a vacuum plate for a fabricating apparatus of a semiconductor device, the vacuum plate includes: a first vacuum panel having a plurality of exhaust holes, the plurality of exhaust holes having same area and same distance from a center of the first vacuum panel, the plurality of exhaust holes being symmetrical and spaced apart from each other; and a second vacuum panel having a sidewall, a pumping hole and an air-load block, the sidewall being vertically protruded along an edge of the second vacuum panel, the air-load block being vertically protruded and symmetrical, a bottom surface of the first vacuum panel contacting a top surface of the sidewall and a top surface of the air-load block, thereby the first and second vacuum panels being combined.

The pumping hole is disposed an exterior of the air-load block and the plurality of exhaust holes are first, second, third and fourth exhaust holes. The air-load block has first and second concave portions of same size. Moreover, the first concave portion corresponds to the first and second exhaust holes, and the second concave portion corresponds to the third and fourth exhaust holes. The first and second concave portions have first and second open holes, respectively. A distance between the first open hole and the first exhaust hole is same as that between the first open hole and the second exhaust hole. Further, a distance between the second open hole and the third exhaust hole is same as that between the second open hole and the fourth exhaust hole. The pumping hole is equally spaced apart from the first and second open holes.

In another aspect, a fabricating apparatus of a semiconductor device, the apparatus includes: a chamber of single substrate type having a susceptor and a vacuum plate therein; a gas supplying unit providing reaction gases to the chamber; and an environmental control unit exhausting the chamber, wherein the vacuum plate includes: a first vacuum panel having a plurality of exhaust holes, the plurality of exhaust holes having same area and same distance from a center of the first vacuum panel, the plurality of exhaust holes being symmetrical and spaced apart from each other; and a second vacuum panel having a sidewall, a pumping hole and an air-load block, the sidewall being vertically protruded along an edge of the second vacuum panel, the air-load block being vertically protruded and symmetrical, a bottom surface of the first vacuum panel contacting a top surface of the sidewall and a top surface of the air-load block, thereby the first and second vacuum panels being combined.

The susceptor is vertically protruded at a center of the chamber and the vacuum plate has a susceptor hole between the plurality of exhaust holes. The fabricating apparatus further includes a plurality of tube type injectors vertically protruded along a bottom edge of the chamber, thereby the reaction gases being provided to the chamber through the plurality of tube type injectors. The vacuum plate has a plurality of injector holes along an edge of the vacuum plate, thereby the plurality of tube type injectors penetrating the plurality of injector holes, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included herewith to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, similar reference numbers will be used throughout the drawings to refer to the same or like parts.

Figure 3:
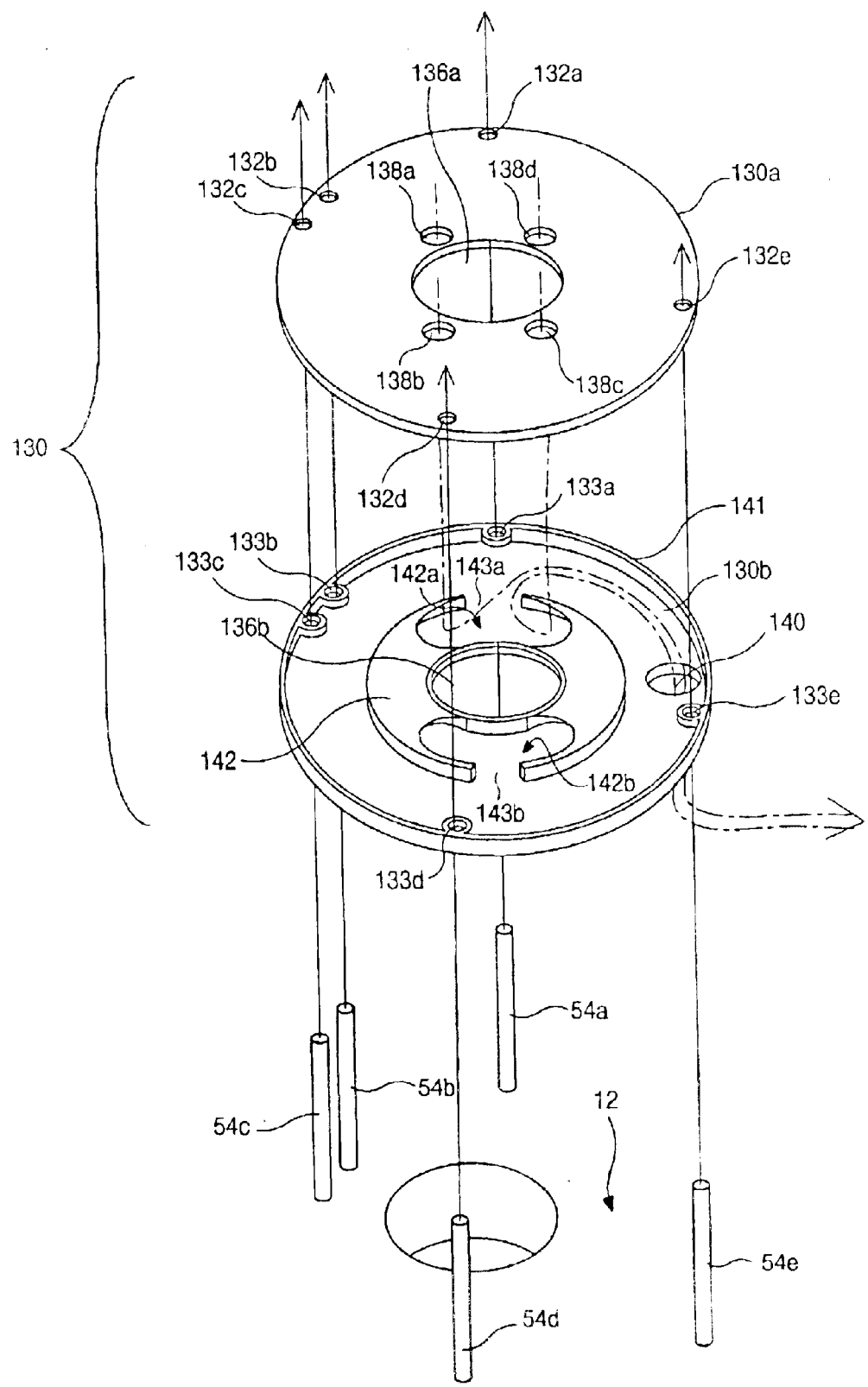
FIG. 3 is a disassembled perspective view of a vacuum plate according to an exemplary embodiment of the present invention.

FIG. 3 is a disassembled perspective view of a vacuum plate according to an exemplary embodiment of the present invention.

In FIG. 3, a vacuum plate 130 including an upper vacuum panel 130a and a lower vacuum panel 130b is disposed on a bottom surface 12 of a chamber. The upper and lower vacuum panels 130a and 130b have upper and lower susceptor holes 136a and 136b at a center thereof, respectively. A susceptor and a plurality of devices for driving the susceptor (not shown) are equipped through the upper and lower susceptor holes 136a and 136b. Furthermore, the upper vacuum panel 130a has a plurality of upper injector holes 132a, 132b, 132c, 132d and 132e at an edge thereof, and the lower vacuum panel 130b has a plurality of lower injector holes 133a, 133b, 133c, 133d, and 133e at an edge thereof. Accordingly, a plurality of injectors 54a, 54b, 54c, 54d and 54e vertically protruded from the bottom surface 12 of the chamber are equipped through the plurality of upper and lower injector holes 132a, 132b, 132c, 132d, 132e, 133a, 133b, 133c, 133d and 133e, respectively.

The upper vacuum panel 130a includes a plurality of exhaust holes 138a, 138b, 138c and 138d between the susceptor hole 136a and the plurality of upper injector holes 132a, 132b, 132c, 132d and 132e. In the exemplary embodiment of FIG 3, the plurality of exhaust holes are first, second, third and fourth exhaust holes 132a, 132b, 132c 132d and 132e having the same distance from the center of the upper vacuum panel 130a and equally spaced apart from each other.

Figure 1:
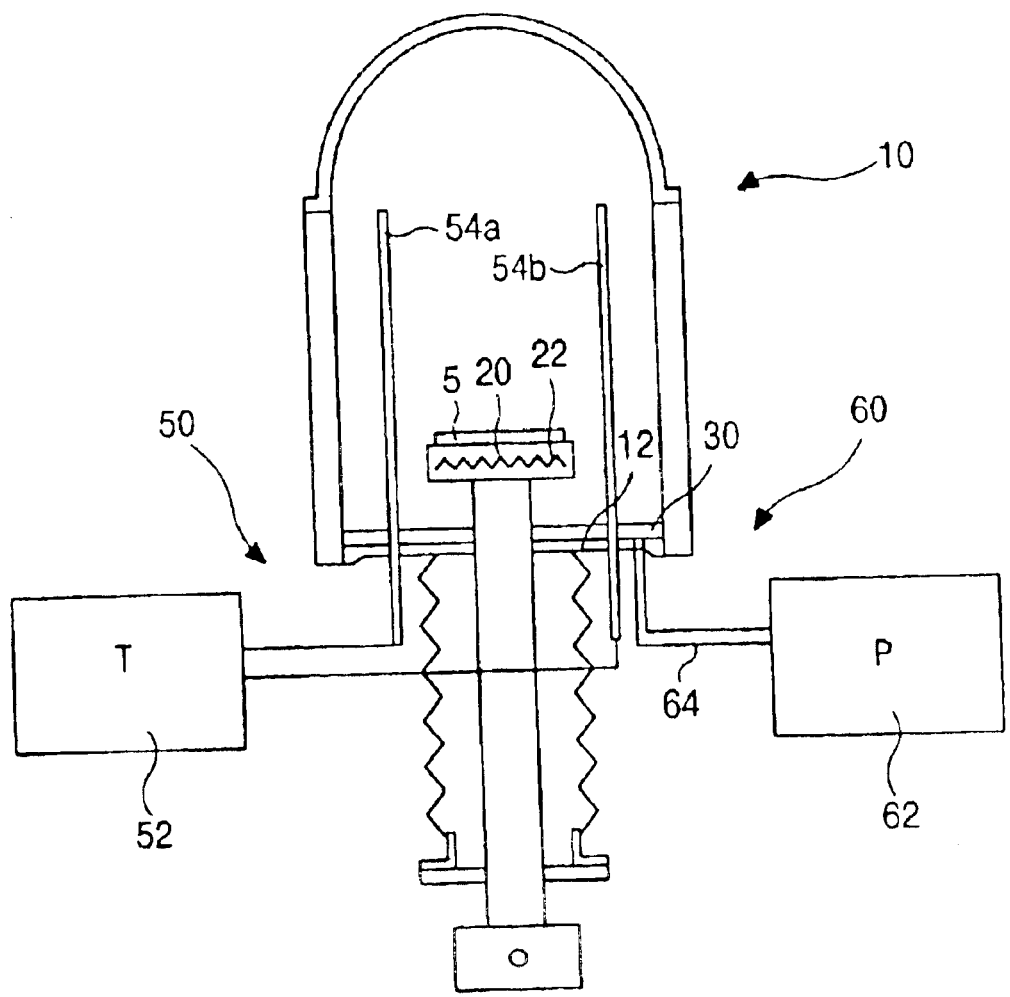
FIG. 1 is a schematic cross-sectional view of a conventional LPCVD apparatus.
Figure 2:
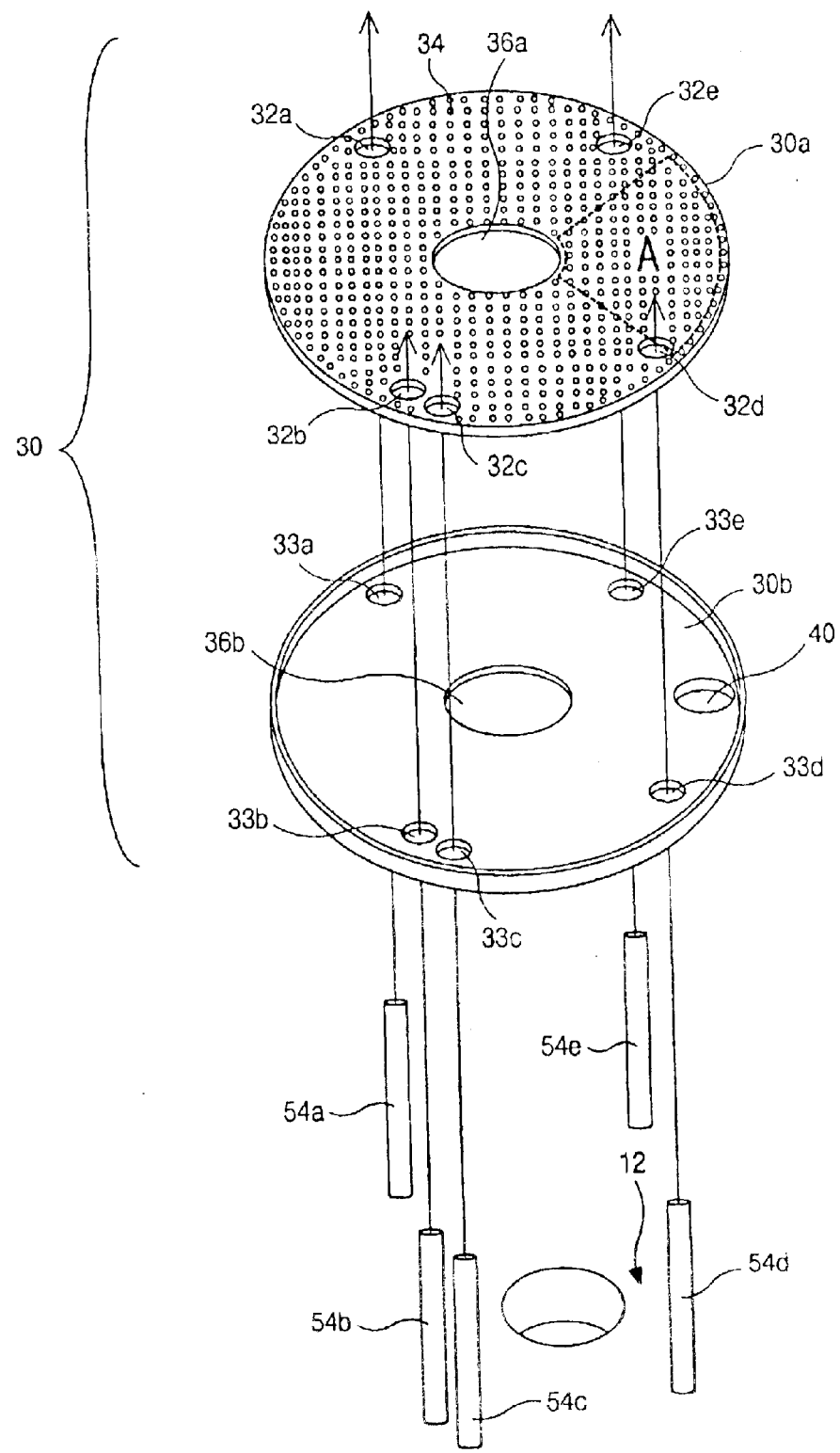
FIG. 2 is a schematic disintegrated view showing a structure of a conventional vacuum plate for an LPCVD apparatus.

The lower vacuum plate 130b includes a sidewall 141 along an edge thereof. Since a top surface of the sidewall 141 contacts a bottom surface of the upper vacuum panel 130a when combining the upper and lower vacuum panels 130a and 130b, a space is formed between the upper and lower vacuum panels 130a and 130b. The lower vacuum panel 130b also includes a pumping hole 140 at an asymmetrical position compared to the array of exhaust holes 138a–d. One end of an exhaust tube 64 (of FIG. 1) is connected to the pumping hole 140 and the other end of the exhaust tube 64 (of FIG. 1) is connected to an exhausting means such as a pump belonging to an environmental control unit 60 (of FIG. 1). Accordingly, air of the chamber is exhausted through the first, second, third and fourth exhaust holes 138a, 138b, 138c and 138d, and stored in the space between the upper and lower vacuum panels 130a and 130b. Next, air stored in the space is exhausted through the pumping hole 140.

Further, the lower vacuum panel 130b includes a symmetrical air-load block 142 to impose a uniform pressure on air exhausted through the first, second, third and fourth exhaust holes 138a, 138b, 138c and 138d. The symmetrical air-load block 142 is disposed at an interior of the sidewall 141 and surrounding the lower susceptor hole 136b. The symmetrical air-load block 142 is as high as the sidewall 142. The symmetrical air-load block 142 has a first concave portion 142a under the first and second exhaust holes 138a and 138b, and a second concave portion 142b under the third and fourth exhaust holes 138c and 138d The first and second concave portions 142a and 142b of symmetrical shapes have first and second open holes 143a and 143b, respectively Therefore, air injected into the air-load block 142 through the first, second, third and fourth exhaust holes 138a, 138b, 138c and 138d is stored in the first and second concave portions 142a and 142b, and then exhausted to the pumping hole 140 through the first and second open holes 143a and 143b. Here, a first distance between the pumping hole 140 and the first open hole 143a is the same as a second distance between the pumping hole 140 and the second open hole 143b. Moreover, a third distance between the first open hole 143a and the first exhaust hole 138a is the same as a fourth distance between the first open hole 143a and the second exhaust hole 138b, and a fifth distance between the second open hole 143b and the third exhaust hole 138c is the same as a sixth distance between the second open hole 143b and the fourth exhaust hole 138d. That is, all the third, fourth, fifth and sixth distances are same. Therefore, the first, second, third and fourth exhaust holes 138a, 138b, 138c and 138d have same exhaust pressures.

Figure 4A:
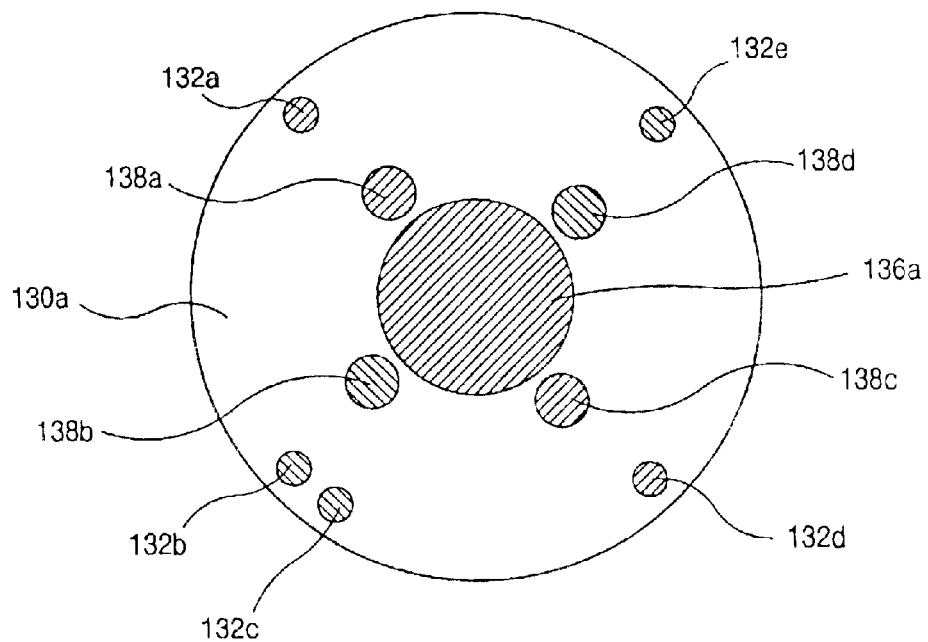
FIG. 4A is a schematic plan view of an upper vacuum panel according to an exemplary embodiment of the present invention.
Figure 4B:
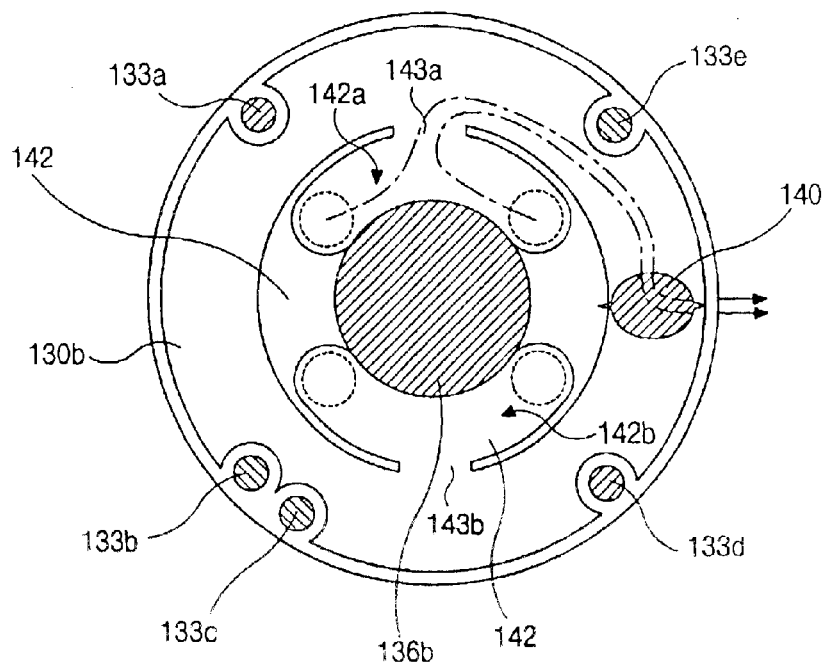
FIG. 4B is a schematic plan view of a lower vacuum panel according to an exemplary embodiment of the present invention.

FIGS. 4A and 4B are schematic plan views of upper and lower vacuum panels according to an exemplary embodiment of the present invention, respectively.

In FIGS. 4A and 4B, air injected into the vacuum plate 130 (of FIG. 3) through first and second exhaust holes 138a and 138b is stored in a first concave portion 142a having a first open hole 143a. Since the first open hole 143a is spaced apart form the first and second exhaust holes 142a and 142b with a same distance, air at the first and second exhaust holes 138a and 138b are exhausted through the first open hole 143a to the pumping hole 140 with a same exhaust pressure. This procedure maybe applied to air at third and fourth exhaust holes 138c and 138d. Furthermore, the first and second open holes 143a and 143b are spaced apart form the pumping hole 140 with a same distance. Therefore, air at the first, second, third and fourth exhaust holes 138a, 138b, 138c and 138d have same exhaust pressure.

In the vacuum plate 130 (of FIG. 3) according to the present invention, first, second, third and fourth exhaust holes 138a, 138b, 138c and 138d are symmetrically formed at the upper vacuum panel 130a and the air-load block 142 applying a same pressure to air injected through the first, second, third and fourth exhaust holes 138a, 138b, 138c and 138d is formed at the lower vacuum panel 130b. Accordingly, air may symmetrically flow from each exhaust hole to the pumping hole 140 with same flow rate under any process condition.

Figure 5:
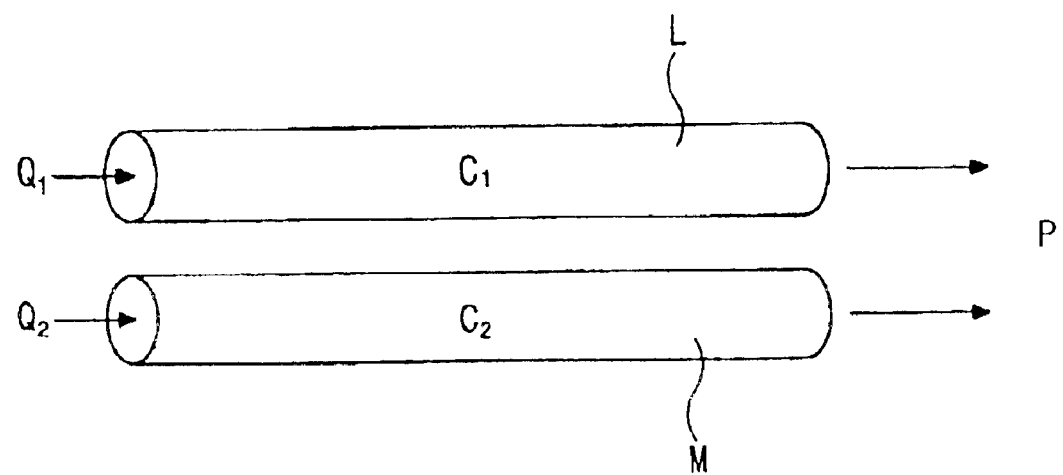
FIG. 5 is a view illustrating the flow of air passing through two pipes

FIG. 5 is a view illustrating the flow of air passing through two pipes.

Generally, air of gas phase flows when a pressure difference exists. In FIG. 5, same pressure is applied to first and second pipes "L" and "M". Since a quantity of flow is proportional to a conductance of corresponding pipe, the quantities of flow through the first and second pipes "L" and "M" may be expressed as following equations.

$$Q_1 = k_1 \cdot C_1 \cdot P$$

$$Q_2 = k_2 \cdot C_2 \cdot P,$$

wherein $Q_1$ is a quantity of flow through the first pipe, $Q_2$ is a quantity of flow through the second pipe, $k_1$ and $k_2$ are constants, $C_1$ is a conductance of the first pipe, $C_2$ is a conductance of the second pipe, and P is a pressure applying to each pipe. Therefore, for the purpose of making same quantity of flow pass through two pipes of same material under same pressure, conductances of two pipes should be equal. This can be simply realized when radii and lengths of two pipes are equal.

These principles may be applied to the vacuum plate 130 (of FIG. 3) according to the present invention. Air is exhausted from the chamber 10 (of FIG. 10) through the first, second, third and fourth exhaust holes 138a, 138b, 138c and 138d (of FIGS. 3 and 4A) of same area symmetrically formed on the upper vacuum panel 130a (of FIGS. 3 and 4A), and then exhausted to the pumping hole 140 (of FIGS. 3 and 4B) of the lower vacuum panel 130b (of FIGS. 3 and 4B) through the first and second open holes 143a and 143b (of FIGS. 3 and 4B) of the first and second concave portions 142a and 142b (of FIGS. 3 and 4B). Air passing through the first and second exhaust holes 138a and 138b (of FIGS. 3 and 4A) is combined by the first concave portion 142a (of FIGS. 3 and 4B), and air passing through the third and fourth exhaust holes 138c and 138d (of FIGS. 3 and 4A) is combined by the second concave portion 142b (of FIGS. 3 and 4B). Here, the first and second concave portions 142a and 142b (of FIGS. 3 and 4B) may correspond to the first and second pipes "L" and "M" (of FIG. 5), respectively. All of a first distance between the first exhaust hole 138a (of FIGS. 3 and 4A) and the first open hole 143a (of FIGS. 3 and 4B), a second distance between the second exhaust hole 138b (of FIGS. 3 and 4A) and the first open hole 143a (of FIGS. 3 and 4B), a third distance between the third exhaust hole 138c (of FIGS. 3 and 4A) and the second open hole 143b (of FIGS. 3 and 4B) and a fourth distance between the fourth exhaust hole 138d (of FIGS. 3 and 4A) and the second open hole 143b (of FIGS. 3 and 4B) are same. Moreover, a fifth distance between the first open hole 143a (of FIGS. 3 and 4B) and the pumping hole 140 (of FIGS. 3 and 4B) and a sixth distance between the second open hole 143b (of FIGS. 3 and 4B) and the pumping hole 140 (of FIGS. 3 and 4B) are same. These mean that two pipes "L" and "M" have the same radius and length. Accordingly, exhaust pressures applied to the first and second open holes 143a and 143b (of FIGS. 3 and 4B) are equally distributed to the first, second, third and fourth exhaust holes 138a, 138b, 138c and 138d (of FIGS. 3 and 4A). If the vacuum plate 130 (of FIG. 3) is equipped to an apparatus, air of the chamber is uniformly exhausted through the first, second, third and fourth exhaust holes 138a, 138b, 138c and 138d (of FIGS. 3 and 4A). Therefore, a thin film may be uniformly deposited.

A thin film of silicon dioxide is formed on a wafer in a single substrate type chamber including a vacuum plate according to the present invention through an LPCVD method. The thin film has an improved property in thickness uniformity The substrate temperature is 750° C. and the pressure is a few torr with reaction gases of $N_2O$ and $SiH_4$. The reaction gases are transformed into the thin film on the wafer through a plurality of chemical reaction steps as follows.

first step: $2N_2O\ 2N_2+O_2$
second step: $SiH_4\ SiH_2+H_2$
third step: $O_2+SiH_2\ SiO_2+H_2$ In the first and second steps, reaction gases of $N_2O$ and $SiH_4$ are dissolved. The products of $O_2$ and $SiH_2$ react through the third step. The activation energy of the reaction is low (about 0.4 eV) enough to form the thin film without intermediate product. In this reaction of CVD method, to keep a uniform process pressure is important. If there exists pressure difference, the thickness uniformity of the thin film is deteriorated.

Under the above-mentioned process conditions, a thin film having a uniformity less than 2.5% over a wafer of 200 mm in diameter is obtained by using a single substrate type chamber for an LPCVD apparatus including a vacuum plate according to the present invention. In contrast with that a uniformity of a thin film formed by using a conventional vacuum plate is about 10%, a thickness uniformity is dramatically improved.

Since a vacuum plate according to the present invention includes a susceptor hole at its center and a plurality of injector holes at its edge, it is equipped to a bottom surface of a single substrate type chamber for an LPCVD apparatus without change of the chamber Moreover, since a vacuum plate includes a plurality of exhaust holes at its upper vacuum panel and an air-load block at its lower vacuum panel, a uniform exhaust pressure is obtained under any process conditions. A vacuum plate according to the present invention is easy to fabricate due to its simple structure and a process range of reaction gases is wide due to a uniform exhaust pressure. Therefore, a thickness uniformity of a thin film is improved.

It will be apparent to those skilled in the art that various modifications and variation can be made in the method of manufacturing a flat panel display device of the present invention without departing from the spirit or scope of the invention. Thus, it is intended that the present invention cover the modifications and variations of this invention provided they come within the scope of the appended claims and their equivalents.

What is claimed is:

1. A vacuum plate for a fabricating apparatus of a semiconductor device, the vacuum plate comprising:
    a first vacuum panel having a plurality of exhaust holes, the plurality of exhaust holes having same area and same distance from a center of the first vacuum panel, the plurality of exhaust holes being symmetrical and spaced apart from each other;
    a second vacuum panel having a pumping hole;
    a sidewall and an air-load block, the sidewall extending vertically along an edge of the second vacuum panel, the air-load block extending vertically and symmetrically, a bottom surface of the first vacuum panel contacting a top surface of the sidewall and a top surface of the air-load block, wherein the first and second vacuum panels form first and second concave portions coupling between the exhaust holes and the pumping hole, and wherein the concave portions have a same size; and
    wherein the plurality of exhaust holes comprises a plurality of first exhaust holes and a plurality of second exhaust holes, wherein the first concave portion encompasses exclusively the plurality of first exhaust holes and the second concave portion encompasses exclusively the plurality of second exhaust holes.

2. The vacuum plate according to claim 1, wherein the pumping hole is disposed outside of an area of the air-load block.

3. The vacuum plate according to claim 1, wherein the plurality of exhaust holes are first, second, third and fourth exhaust holes.

4. A vacuum plate for a fabricating apparatus of a semiconductor device, the vacuum plate comprising:
    a first vacuum panel having a plurality of exhaust boles, the plurality of exhaust holes having same area and same distance from a center of the first vacuum panel, the plurality of exhaust holes being symmetrical and spaced apart from each other;
    a second vacuum panel having a pumping hole; and
    a sidewall and an air-load block, the sidewall extending vertically along an edge of the second vacuum panel, the air-load block extending vertically and symmetrically, a bottom surface of the first vacuum panel contacting a top surface of the sidewall and a top surface of the air-load block, wherein the first and second vacuum panels form a plurality of concave portions coupling between the exhaust holes and the pumping hole, and wherein the concave portions have a same size;
    wherein the air-load block has first and second concave portions of same size, wherein the first concave portion encompasses exclusively a first and second of the plurality of exhaust holes and the second concave portion encompasses exclusively a third and fourth of the plurality of exhaust holes.

5. The vacuum plate according to claim 4, wherein the first and second concave portions have first and second open holes, respectively leading from the first and second exhaust holes to the pumping hole and from the third and fourth exhaust holes to the pumping hole.

6. The vacuum plate according to claim 5, wherein a distance between the first open hole and the first exhaust hole is same as that between the first open hole and the second exhaust hole.

7. The vacuum plate according to claim 5, wherein a distance between the second open hole and the third exhaust hole is same as that between the second open hole and the fourth exhaust hole.

8. The vacuum plate according to claim 5, wherein the pumping hole is equally spaced apart from the first and second open holes.

9. A fabricating apparatus of a semiconductor device, the apparatus comprising:
a chamber of single substrate type having a susceptor and a vacuum plate therein;
a gas supplying unit providing reaction gases to the chamber; and an environmental control unit exhausting the chamber, wherein the vacuum plate comprises: a first vacuum panel having a plurality of exhaust holes, the plurality of exhaust holes having same area and same distance from a center of the first vacuum panel, the plurality of exhaust holes being symmetrical and spaced apart from each other; a second vacuum panel having a pumping hole; and a sidewall and an air-load block, the sidewall extending vertically along an edge of the second vacuum panel, the air-load block extending vertically and symmetrically, a bottom surface of the first vacuum panel contacting a top surface of the sidewall and a top surface of the air-load block, wherein the first and second vacuum panels form first and second concave portions coupling between the exhaust holes and the pumping hole, and wherein the concave portions have a same size; wherein the plurality of exhaust holes comprises a plurality of first exhaust holes and a plurality of second exhaust holes, wherein the first concave portion encompasses exclusively the plurality of first exhaust holes and the second concave portion encompasses exclusively the plurality of second exhaust holes.

10. The apparatus according to claim 9, wherein the susceptor protrudes vertically at a center of the chamber.

11. The apparatus according to claim 10, wherein the vacuum plate has a susceptor hole between the plurality of exhaust holes.

12. The apparatus according to claim 9, further comprising a plurality of tube type injectors vertically protruded along a bottom edge of the chamber, thereby the reaction gases being provided to the chamber through the plurality of tube type injectors.

13. The apparatus according to claim 12, wherein the vacuum plate has a plurality of injector holes along an edge of the vacuum plate, thereby the plurality of tube type injectors penetrating the plurality of injector holes, respectively.

14. A vacuum plate for a fabricating apparatus of a semiconductor device, the vacuum plate comprising:
a first vacuum panel having a plurality of exhaust holes;
a second vacuum panel having a pumping hole;
a sidewall extending vertically along an edge of the second vacuum panel, a top surface of the sidewall contacting a bottom surface of the first vacuum panel; and
an air-load block extending vertically from the second vacuum panel and having a perimeter, a top surface of the air-load block contacting a bottom surface of the first vacuum panel, the air-load block further including first and second concave portions divided by a shielding wall that contacts the first and second vacuum panels inside the perimeter of the air-load block; and
wherein the plurality of exhaust holes comprises a plurality of first exhaust holes and a plurality of second exhaust holes, wherein the first concave portion encompasses exclusively the plurality of first exhaust holes and the second concave portion encompasses exclusively the plurality of second exhaust holes.

15. The apparatus according to claim 14, wherein the pumping hole is disposed outside of the perimeter of the air-load block.

16. The apparatus according to claim 14, wherein first and second exhaust holes of the plurality of exhaust holes are encompassed within the first concave portion, and third and fourth exhaust holes of the plurality of exhaust holes are encompassed within the second concave portion.

17. The apparatus according to claim 14, wherein the first vacuum panel has a plurality of injector holes for receiving a plurality of tube type injectors.

* * * * *